US012376263B2

(12) United States Patent
Chiang et al.

(10) Patent No.: US 12,376,263 B2
(45) Date of Patent: Jul. 29, 2025

(54) LIQUID COOLING DEVICE APPLIED TO A PLURALITY OF OPTICAL TRANSCEIVERS AND RELATED ELECTRONIC APPARATUS

(71) Applicant: Wistron Corporation, New Taipei (TW)

(72) Inventors: Cheng-Han Chiang, New Taipei (TW); Cheng-Wei Chen, New Taipei (TW); Yu-Chuan Wu, New Taipei (TW); Hua Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 178 days.

(21) Appl. No.: 17/884,558

(22) Filed: Aug. 9, 2022

(65) Prior Publication Data

US 2023/0328924 A1    Oct. 12, 2023

(30) Foreign Application Priority Data

Apr. 7, 2022    (TW) ................................. 111113257

(51) Int. Cl.
*H05K 7/20*    (2006.01)
*H04B 10/40*    (2013.01)

(52) U.S. Cl.
CPC ......... *H05K 7/20272* (2013.01); *H04B 10/40* (2013.01); *H05K 7/20263* (2013.01)

(58) Field of Classification Search
CPC . H05K 7/20272; H05K 7/20263; H04B 10/40
See application file for complete search history.

(56) References Cited

U.S. PATENT DOCUMENTS

| | | | | |
|---|---|---|---|---|
| 6,980,437 | B2* | 12/2005 | Bright | H04B 1/036 |
| | | | | 361/704 |
| 8,449,331 | B2* | 5/2013 | Phillips | H01R 13/6581 |
| | | | | 439/607.21 |
| 9,846,287 | B2 | 12/2017 | Mack | |
| 10,667,423 | B2* | 5/2020 | Morihata | G02B 6/0008 |
| 11,079,559 | B2* | 8/2021 | Leclair | G06F 13/4022 |
| 11,303,059 | B2* | 4/2022 | Duan | H05K 7/20418 |
| 11,729,941 | B2* | 8/2023 | Yang | H01R 13/518 |
| | | | | 439/199 |
| 2015/0029667 | A1* | 1/2015 | Szczesny | G02B 6/4261 |
| | | | | 361/700 |
| 2015/0077937 | A1* | 3/2015 | Daly | G02B 6/4268 |
| | | | | 361/699 |

(Continued)

FOREIGN PATENT DOCUMENTS

TW    I733445    7/2021

*Primary Examiner* — Michael A Matey
(74) *Attorney, Agent, or Firm* — Winston Hsu

(57) ABSTRACT

A liquid cooling device is applied to a plurality of optical transceivers of an electronic apparatus. The liquid cooling device includes a main body, a channel module and a tube module. The main body has an accommodating structure, an inlet structure and an outlet structure. The inlet structure and the outlet structure are connected to the accommodating structure. The main body covers at least a part of the plurality of optical transceivers. The channel module is disposed inside the accommodating structure. The tube module has an inlet tube and an outlet tube respectively disposed on the inlet structure and the outlet structure.

20 Claims, 8 Drawing Sheets

(56) References Cited

U.S. PATENT DOCUMENTS

| | | | | |
|---|---|---|---|---|
| 2017/0135246 | A1* | 5/2017 | Lunsman | H05K 7/20254 |
| 2017/0196123 | A1* | 7/2017 | Kelty | H04Q 1/035 |
| 2019/0215989 | A1* | 7/2019 | Su | H05K 5/03 |
| 2019/0246523 | A1* | 8/2019 | Boyden | H05K 7/20772 |
| 2020/0006884 | A1* | 1/2020 | Weltsch | H01R 13/514 |
| 2020/0142142 | A1* | 5/2020 | Luo | G02B 6/4269 |
| 2020/0304889 | A1* | 9/2020 | Weltsch | H05K 7/20772 |
| 2021/0105915 | A1* | 4/2021 | Wang | H05K 7/20418 |
| 2021/0153385 | A1* | 5/2021 | Lu | H05K 7/20254 |
| 2023/0086448 | A1* | 3/2023 | Chen | H05K 7/20254 |
| | | | | 361/695 |

* cited by examiner

LIQUID COOLING DEVICE APPLIED TO A PLURALITY OF OPTICAL TRANSCEIVERS AND RELATED ELECTRONIC APPARATUS

BACKGROUND OF THE INVENTION

1. Field of the Invention

The present application relates to a liquid cooling device and a related electronic apparatus, and more particularly, to a liquid cooling device is applied to a plurality of optical transceivers and the related electronic apparatus.

2. Description of the Prior Art

With the advanced technology, the demand for network communication and cloud services is greatly increased, and the data to be processed in the data center is increased, so that the computing performance and stability requirements of the server are also increased accordingly. For improving the computing performance and the stability of the server, the server is designed to prevent effect of high energy consumption and high heat generation. The conventional server utilizes the air cooling module to dissipate heat generated by the server. However, as the power of the server is enlarged, the air cooling module cannot effectively solve a heat accumulation phenomenon of the conventional server; even if the liquid cooling module is used for heat dissipation, the conventional liquid cooling module has to attach to the heat source, which means each liquid cooling module contacts against the corresponding heat source, and it is inconvenient to use when the heat source is in need of repair and replacement.

SUMMARY OF THE INVENTION

The present application provides a liquid cooling device is applied to a plurality of optical transceivers and the related electronic apparatus for solving above drawbacks.

According to the claimed application, a liquid cooling device is applied to a plurality of optical transceivers. The liquid cooling device includes a main body, a channel module and a tube module. The main body has an accommodating structure, an inlet structure and an outlet structure. The inlet structure and the outlet structure are connected to the accommodating structure. The channel module is disposed inside the accommodating structure. The tube module has an inlet tube and an outlet tube. The inlet tube and an outlet tube are respectively disposed on the inlet structure and the outlet structure.

According to the claimed application, coolant is accommodated inside the accommodating structure, and a flowing direction of the coolant is guided by the tube module.

According to the claimed application, the channel module includes an exhausting channel, the exhausting channel has a plurality of sections connected to each other, the plurality of sections are bent to align with corresponding sides of the accommodating structure.

According to the claimed application, the channel module comprises a plurality of heat dissipation fins, two opposite ends of each of the plurality of heat dissipation fins respectively point toward the inlet structure and the outlet structure.

According to the claimed application, one of the plurality of heat dissipation fins is spaced from an adjacent heat dissipation fin via a predefined distance.

According to the claimed application, the plurality of heat dissipation fins at least includes a first fin group and a second fin group, the first fin group and the second fin group respectively align with any one or several of the plurality of optical transceivers.

According to the claimed application, the first fin group is spaced from the second fin group, and a first gap between the first fin group and the second fin group aligns with a second gap between any two adjacent optical transceivers of the plurality of optical transceivers.

According to the claimed application, a structural size and an arrangement density of the first fin group are different from a structural size and an arrangement density of the second fin group.

According to the claimed application, the first fin group and the second fin group are arranged in symmetry.

According to the claimed application, the main body further has a cover, and an opening of the accommodating structure is sealed by the cover.

According to the claimed application, a longitudinal direction of each of the plurality of optical transceivers comprises a first section and a second section connected with each other, a heat source is disposed on at least one of the first section and the second section, a length of the main body corresponds to a length of the first section or the second section, or corresponds to a sum of lengths of the first section and the second section.

According to the claimed application, a width of the main body corresponds to a sum of widths of the plurality of optical transceivers along a transverse direction, and at least one section of the plurality of optical transceivers is sheltered by the main body.

According to the claimed application, the inlet structure and the outlet structure are disposed on the same side of the main body, or disposed on two adjacent sides of the main body, or disposed on two opposite sides of the main body.

According to the claimed application, an electronic apparatus includes a plurality of optical transceivers and a liquid cooling device. The at least one liquid cooling device is applied to the plurality of optical transceivers. The liquid cooling device includes a main body, a channel module and a tube module. The main body has an accommodating structure, an inlet structure and an outlet structure. The inlet structure and the outlet structure are connected to the accommodating structure. The channel module is disposed inside the accommodating structure. The tube module has an inlet tube and an outlet tube. The inlet tube and an outlet tube are respectively disposed on the inlet structure and the outlet structure.

According to the claimed application, the electronic apparatus includes two liquid cooling devices, and the outlet tube of one liquid cooling device of the two liquid cooling devices is connected to the inlet tube of another liquid cooling device of the two liquid cooling devices.

These and other objectives of the present application will no doubt become obvious to those of ordinary skill in the art after reading the following detailed description of the preferred embodiment that is illustrated in the various figures and drawings.

DETAILED DESCRIPTION

Figure 1:
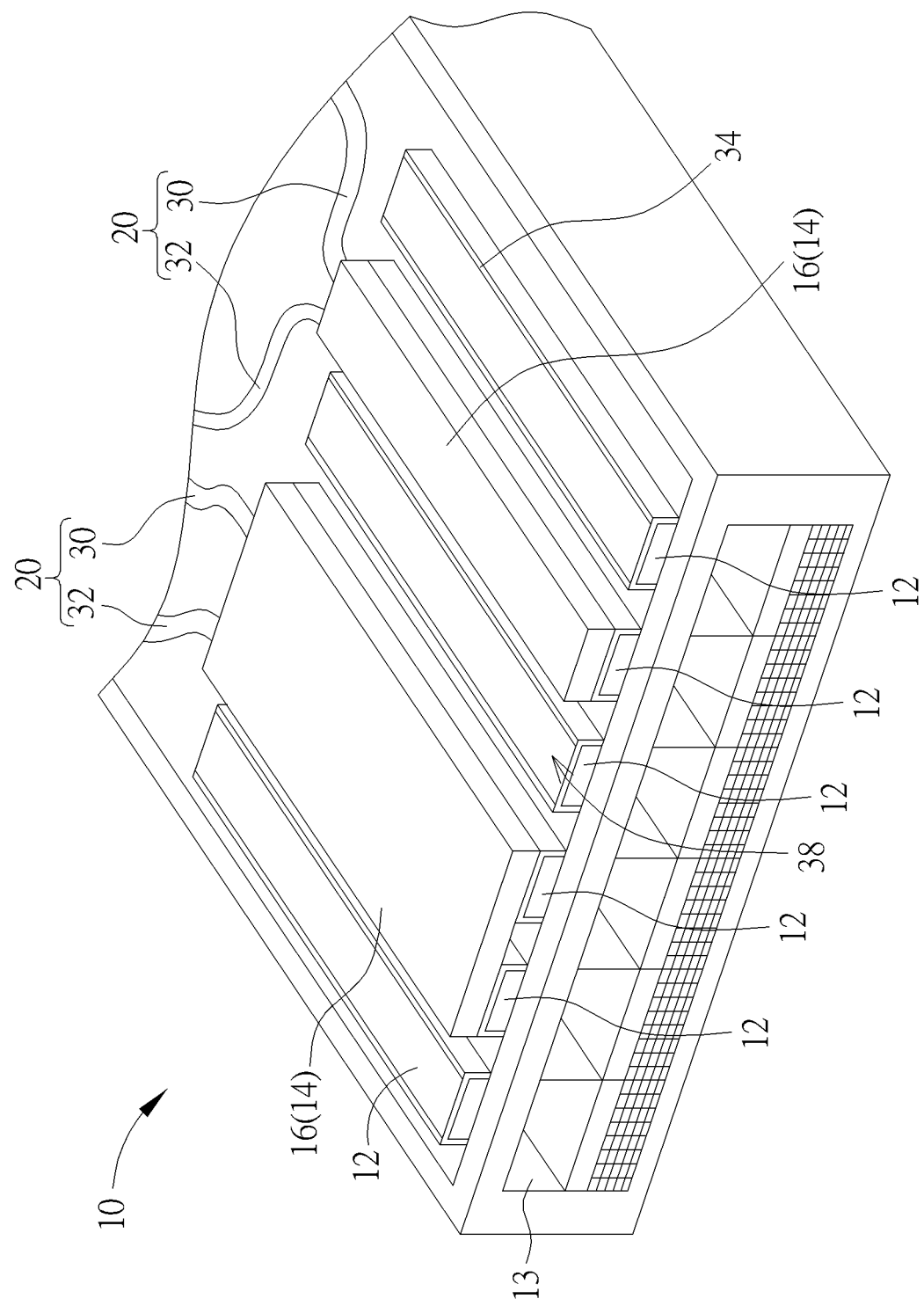
FIG. 1 is a diagram of an electronic apparatus according to a first embodiment of the present application.

Please refer to FIG. 1. FIG. 1 is a diagram of an electronic apparatus 10 according to a first embodiment of the present application. The electronic apparatus 10 can be a server apparatus or any signal transmission apparatus. The electronic apparatus 10 can include a plurality of optical transceivers 12 and at least one liquid cooling device 14. The optical transceivers 12 can have properties of high heat generation rate and high transmission rate, so that the liquid cooling device 14 can be used to cool the optical transceivers 12. The liquid cooling device 14 is close to the optical transceivers 12, and can be designed in accordance with a number of the optical transceivers 12, so as to simultaneously dissipate heat generated by one or some of the plurality of optical transceivers 12.

Figure 2:
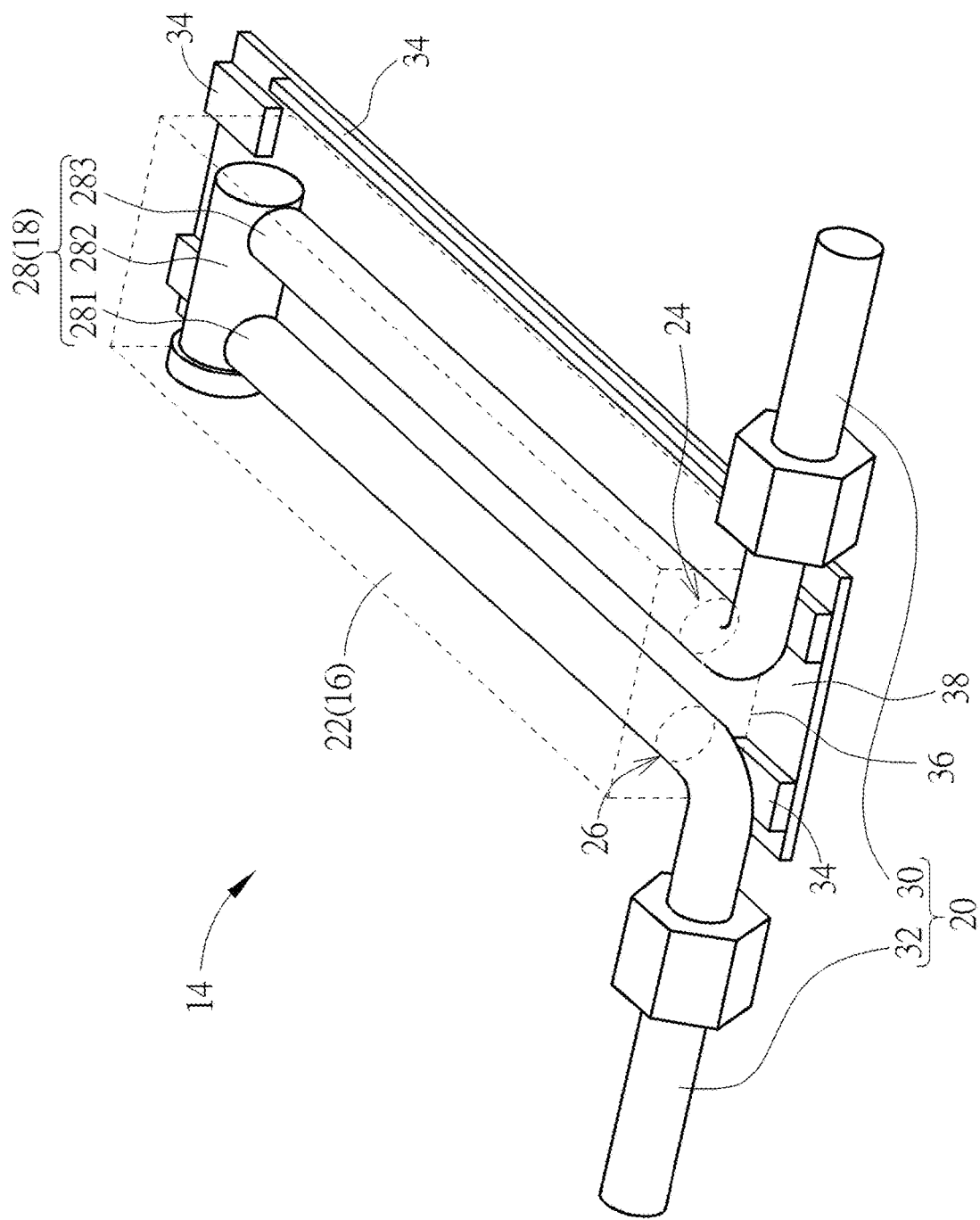
FIG. 2 is a diagram of a liquid cooling device according to the first embodiment of the present application.

Please refer to FIG. 1 and FIG. 2. FIG. 2 is a diagram of the liquid cooling device 14 according to the first embodiment of the present application. The liquid cooling device 14 can include a main body 16, a channel module 18 and a tube module 20. The main body 16 can cover at least one section of the plurality of optical transceivers 12; for example, the main body 16 can cover the whole section of the plurality of optical transceivers 12, as shown in FIG. 2. However, the main body 16 may cover the front section of the plurality of optical transceivers 12 adjacent to a connection interface 13, or cover the rear section of the plurality of optical transceivers 12 distant from the connection interface 13, or cover the middle section of the plurality of optical transceivers 12 located between the front section and the rear section.

The main body 16 can include an accommodating structure 22 used to accommodate coolant. Chemical property of the coolant can depend on a design demand, and a detailed description is omitted herein for simplicity. The main body 16 can further include an inlet structure 24 and an outlet structure 26 connected with the accommodating structure 22. The channel module 18 can include an exhausting channel 28 disposed inside the accommodating structure 22 and used to guide a flowing direction of the coolant. The exhausting channel 28 can include a plurality of sections 281, 282 and 283 connected and bent to each other, and used to increase a contacting surface of the exhausting channel 28. In the embodiment, the plurality of sections 281, 282 and 283 can respectively align with corresponding sides of the accommodating structure 22, such as the left side, the rear side and the right side of the accommodating structure 22; the inlet structure 24 and the outlet structure 26 can be located on the front side of the accommodating structure 22.

The tube module 20 can include an inlet tube 30 and an outlet tube 32 respectively disposed on the inlet structure 24 and the outlet structure 26. The external coolant can flow into the accommodating structure 22 through the inlet tube 30, and then carry the heat from the accommodating structure 22 through the outlet tube 32, so as to dissipate the heat of the optical transceivers 12. In the present application, the liquid cooling device 14 is not locked onto the optical transceiver 12, and can be installed on a supporting frame 34 inside the electronic apparatus 10; the optical transceiver 12 can be disposed inside the supporting frame 34 in a detachable manner. When the liquid cooling device 14 is installed on the supporting frame 34, a bottom surface 36 of the liquid cooling device 14 can directly contact against a top surface 38 of the optical transceiver 12 for rapid heat dissipation.

In the embodiment of the present application, the liquid cooling device 14 can be designed to correspond to one optical transceiver 12, such as the right-side liquid cooling device 14 shown in FIG. 1; however, an application of assembly of the optical transceiver 12 and the liquid cooling device 14 is not limited to the above-mentioned embodiment, and depends on an actual demand. The present application may change a size of the main body 16 of the liquid cooling device 14 in accordance with the design demand, for example, the width of the main body 16 can be enlarged to correspond to a sum of widths of two or three optical transceivers 12, such as the left-side liquid cooling device 14 shown in FIG. 1. In addition, the liquid cooling device 14 is disposed on the supporting frame 34 and not locked with the optical transceiver 12, so that any one of the optical transceivers 12 can be removed for repair or replacement in accordance with the actual demand without constraint of the liquid cooling device 14.

If the electronic apparatus 10 includes two or more than two liquid cooling devices 14, the outlet tube 32 of one liquid cooling device 14 (such as the right-side liquid cooling device 14 shown in FIG. 1) can be connected to the inlet tube 30 of another liquid cooling device 14 (such as the left-side liquid cooling device 14 shown in FIG. 1), which means the liquid cooling devices 14 can be set in series connection, and the coolant can flow between the plurality of liquid cooling devices 14. The liquid cooling device 14 of accommodating the coolant colder than a temperature of the relevant optical transceiver 12 can belong to a design scope of the present application.

Figure 3:
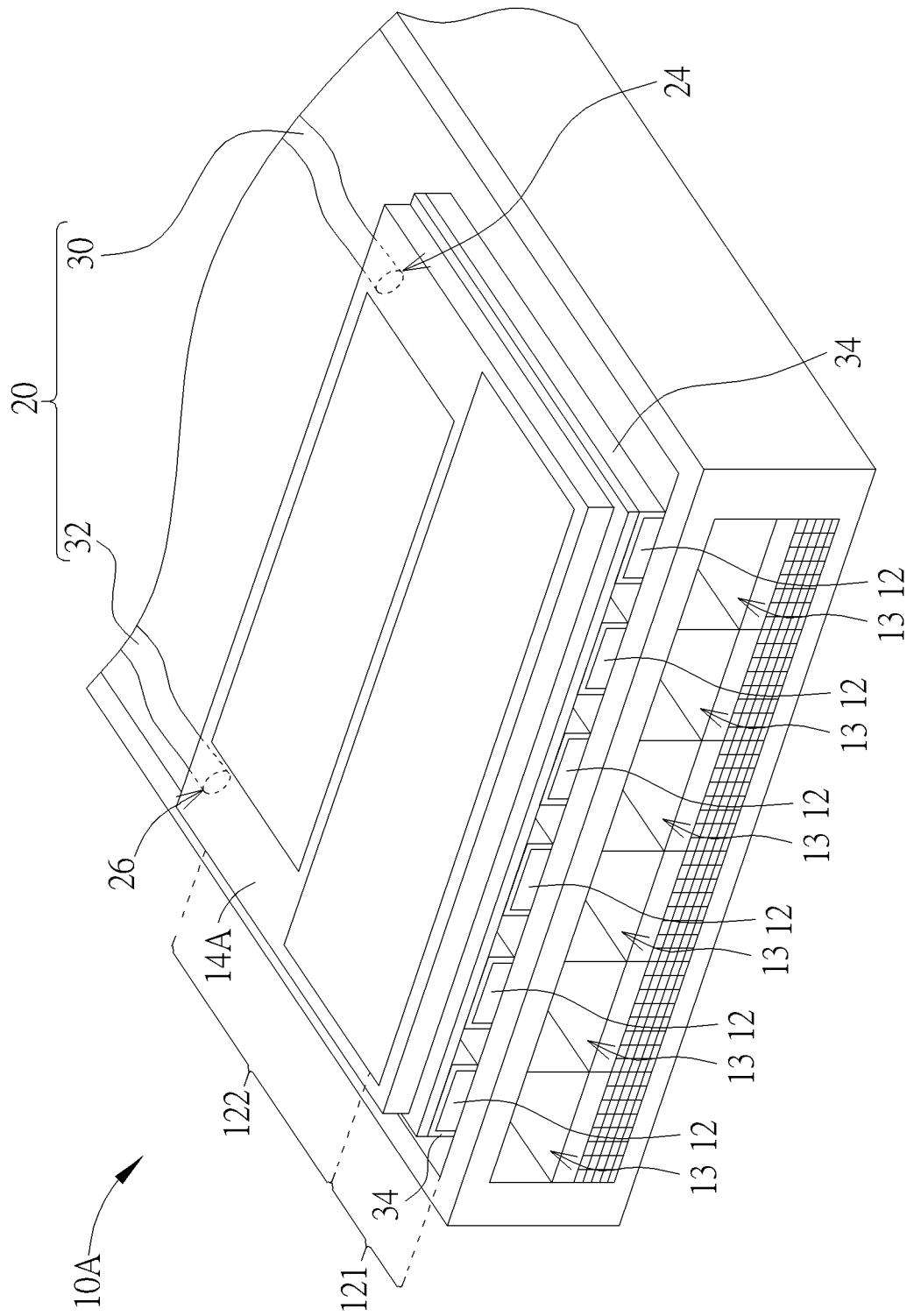
FIG. 3 is a diagram of the electronic apparatus according to a second embodiment of the present application.
Figure 4:
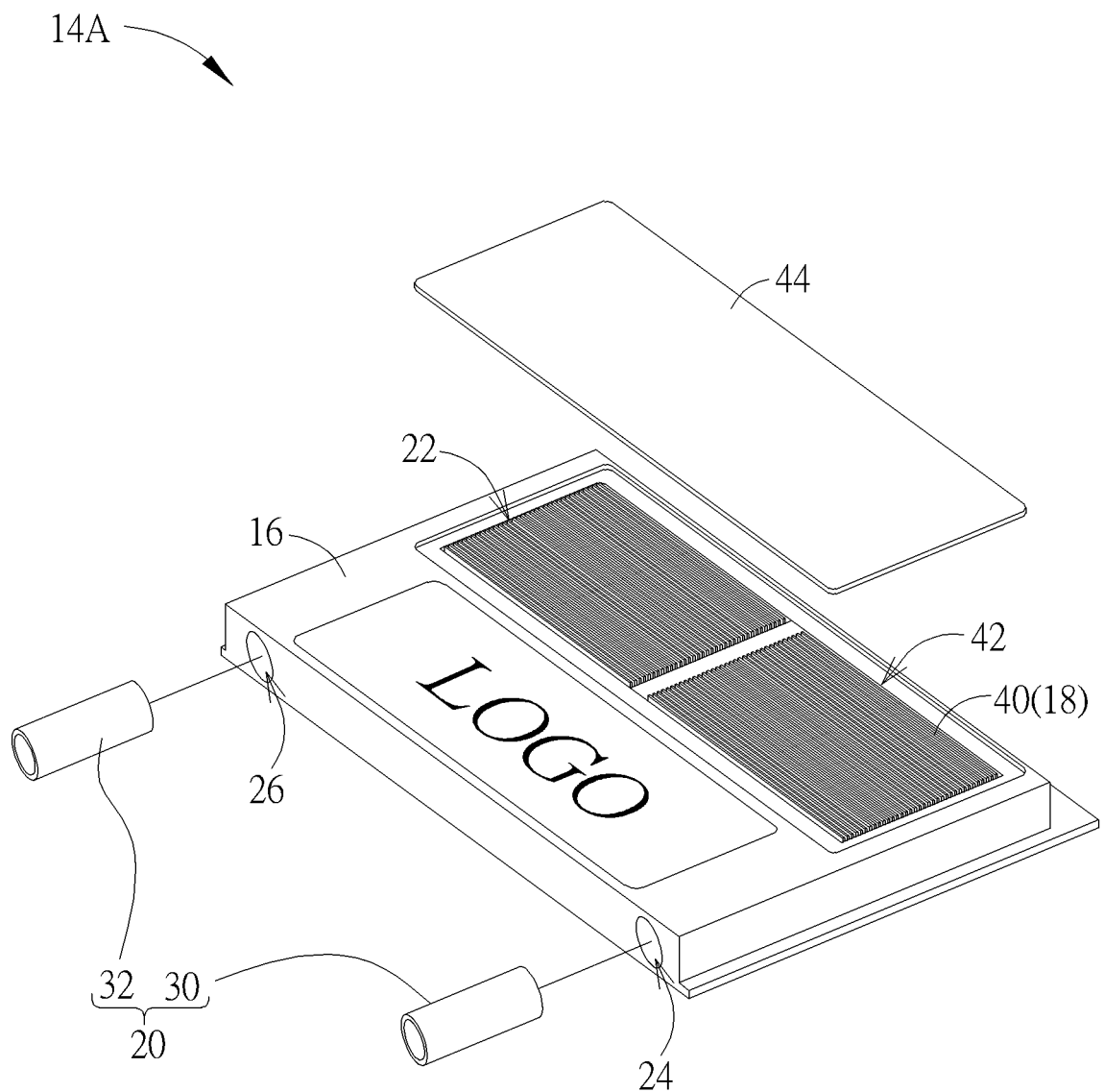
FIG. 4 is a diagram of the liquid cooling device according to the second embodiment of the present application.
Figure 5:
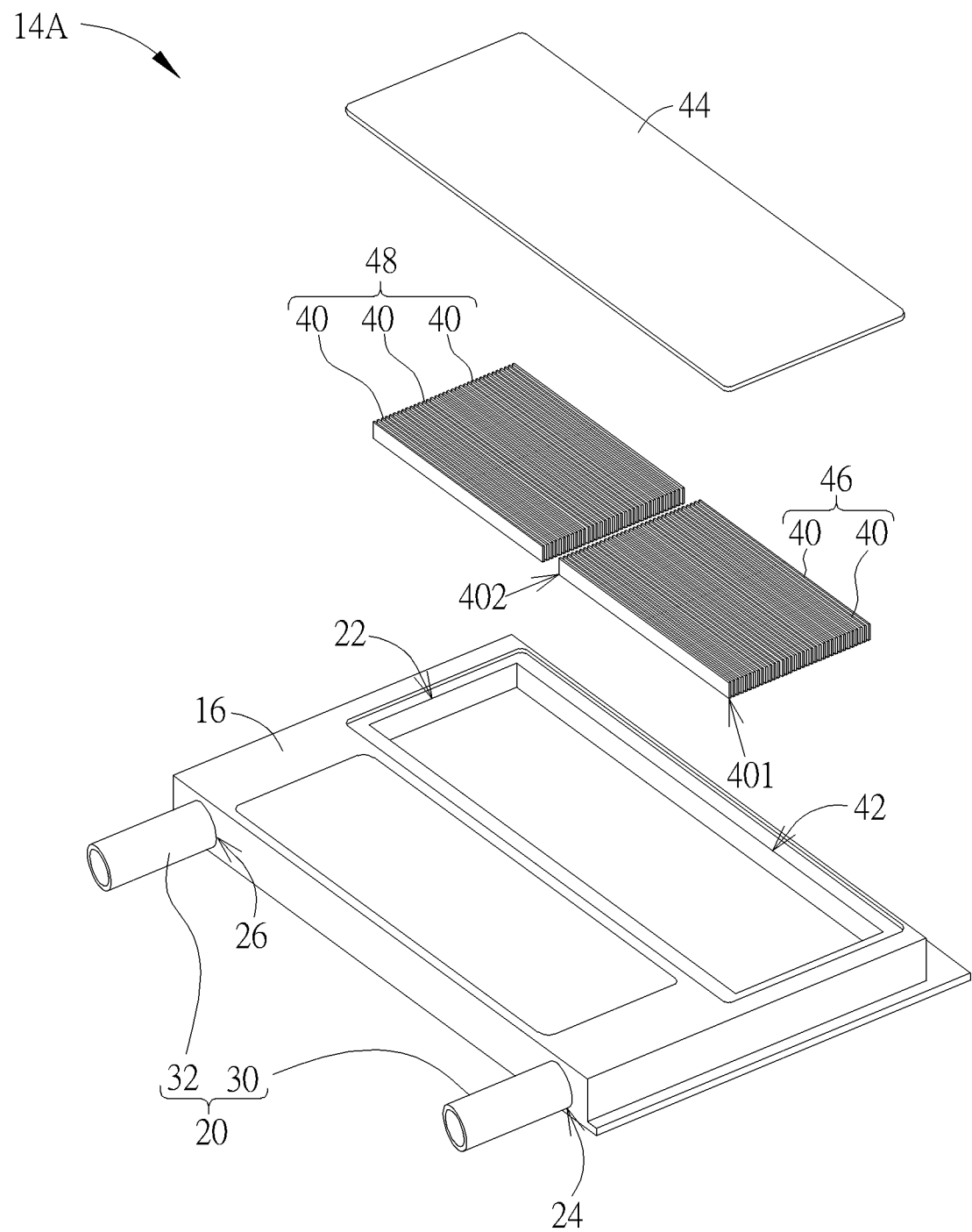
FIG. 5 is an exploded diagram of a part of the liquid cooling device according to the second embodiment of the present application.

Please refer to FIG. 3 to FIG. 5. FIG. 3 is a diagram of the electronic apparatus 10A according to a second embodiment of the present application. FIG. 4 is a diagram of the liquid cooling device 14A according to the second embodiment of the present application. FIG. 5 is an exploded diagram of a part of the liquid cooling device 14A according to the second embodiment of the present application. In the second embodiment, elements having the same numerals as ones of the first embodiment have the same structures and functions, and a detailed description is omitted herein for simplicity. The channel module 18 of the liquid cooling device 14A can include a plurality of heat dissipation fins 40. The plurality of heat dissipation fins 40 can be arranged to form a flowing channel of the coolant for heat dissipation and guiding of the coolant. The plurality of heat dissipation fins 40 can be installed into the accommodating structure 22 via an opening 42 of the accommodating structure 22. The main body 16 can utilize a cover 44 to seal the opening 42 for preventing the coolant from leaking out of the accommodating structure 22.

As shown in FIG. 5, two opposite ends 401 and 402 of each heat dissipation fin 40 can respectively point toward the inlet structure 24 and the outlet structure 26, and the plurality of heat dissipation fins 40 can be arranged in actual parallel or in substantial parallel. Therefore, one heat dissipation fin 40 can be spaced from an adjacent heat dissipation fin 40 via a predefined distance to form a micro flowing channel. The coolant can flow inside the flowing channel, so that the coolant flowing into the accommodating structure 22 through the inlet structure 24 can smoothly flow toward the outlet structure 26 and then flow out of the accommodating structure 22. The present application does not constrain an actual value of the predefined distance, which means a size and a number of the micro flowing channel can depend on the design demand.

In the second embodiment, the liquid cooling device 14A can simultaneously dissipate the heat generated by the plurality of optical transceivers 12, so that the width of the main body 16 can correspond to a sum of widths of the plurality of optical transceivers 12, and the liquid cooling device 14A can completely cover the plurality of optical transceivers 12. The heat dissipation fin 40 can at least include a first fin group 46 and a second fin group 48, and the first fin group 46 and the second fin group 48 can respectively align with one or some of the plurality of optical transceivers 12. For example, the first fin group 46 may align with three optical transceivers 12 on the right side of the electronic apparatus 10A, and the second fin group 48 may align with three optical transceivers 12 on the left side of the electronic apparatus 10A; an application of the first fin group 46 and the second fin group 48 can depend on the actual demand.

Besides, the first fin group 46 may be set close to the second fin group 48, or the first fin group 46 may be spaced from the second fin group 48. In the present application, the first fin group 46 and the second fin group 48 are arranged in symmetry, and can have the same or similar structural size and arrangement density. The first fin group 46 can be preferably distant from the second fin group 48, and a first gap between the first fin group 46 and the second fin group 48 can align with a second gap between assembly of the three optical transceivers 12 in the right side and assembly of the three optical transceivers 12 in the left side, which means the first gap between the first fin group 46 and the second fin group 48 can align with the second gap between two adjacent optical transceivers 12 in middle position.

Figure 6:
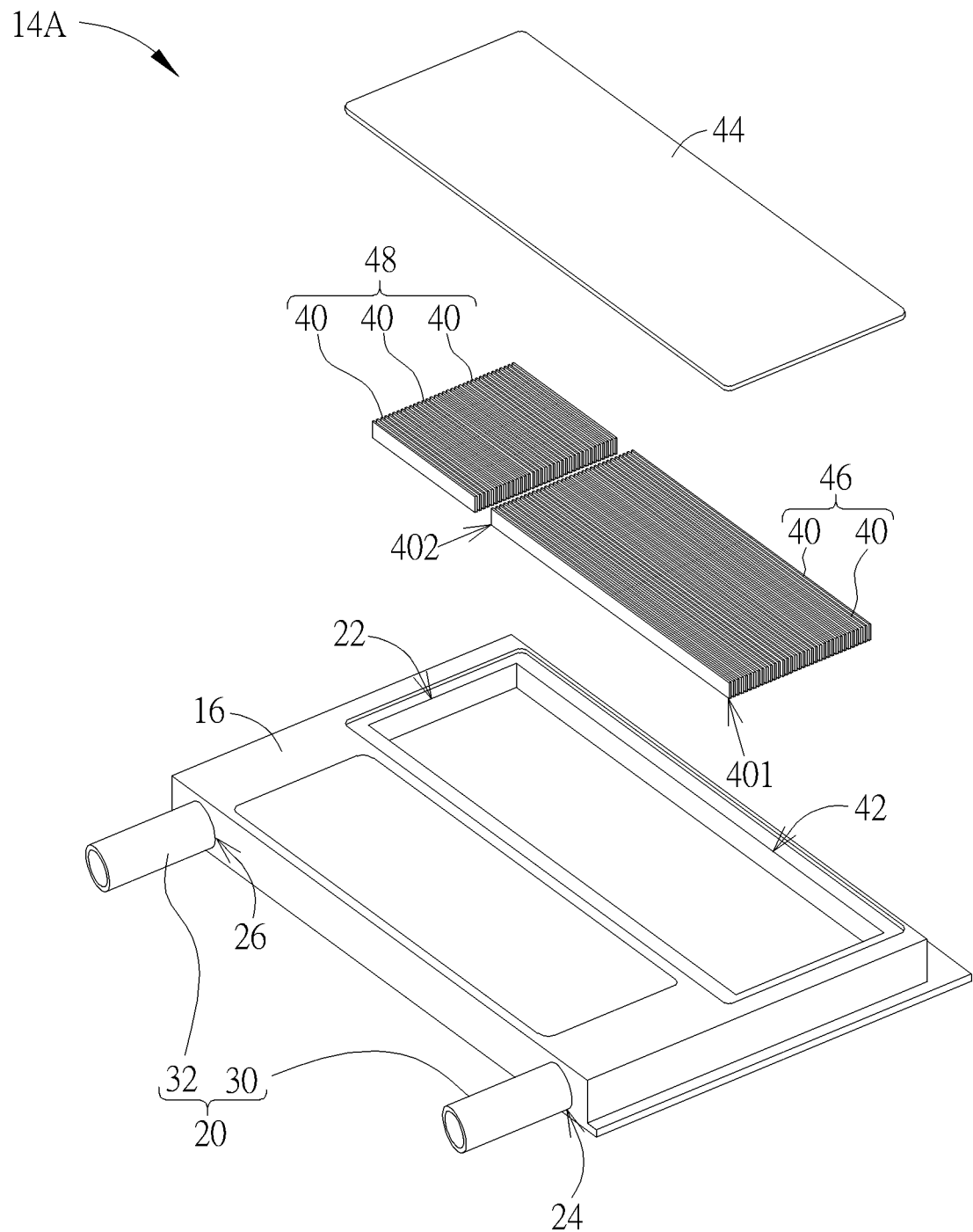
FIG. 6 is an exploded diagram of the liquid cooling device in other application according to the second embodiment of the present application.

Please refer to FIG. 6. FIG. 6 is an exploded diagram of the liquid cooling device 14A in other application according to the second embodiment of the present application. As shown in FIG. 6, the structural size and the arrangement density of the first fin group 46 can be different from the structural size and the arrangement density of the second fin group 48. For example, the first fin group 46 may align with four optical transceivers 12 on the right side of the electronic apparatus 10A, and the second fin group 48 may align with two optical transceivers 12 on the left side of the electronic apparatus 10A; variation of the first fin group 46 and the second fin group 48 is not limited to the above-mentioned embodiment, which depends on the actual demand. Moreover, if the heat generated by the right-side four optical transceivers 12 is greater than the heat generated by the left-side two optical transceivers 12, the first fin group 46 can include the heat dissipation fin 40 with large numbers and greater density, and the second fin group 48 can include the heat dissipation fin 40 with less numbers and smaller density.

Figure 7:
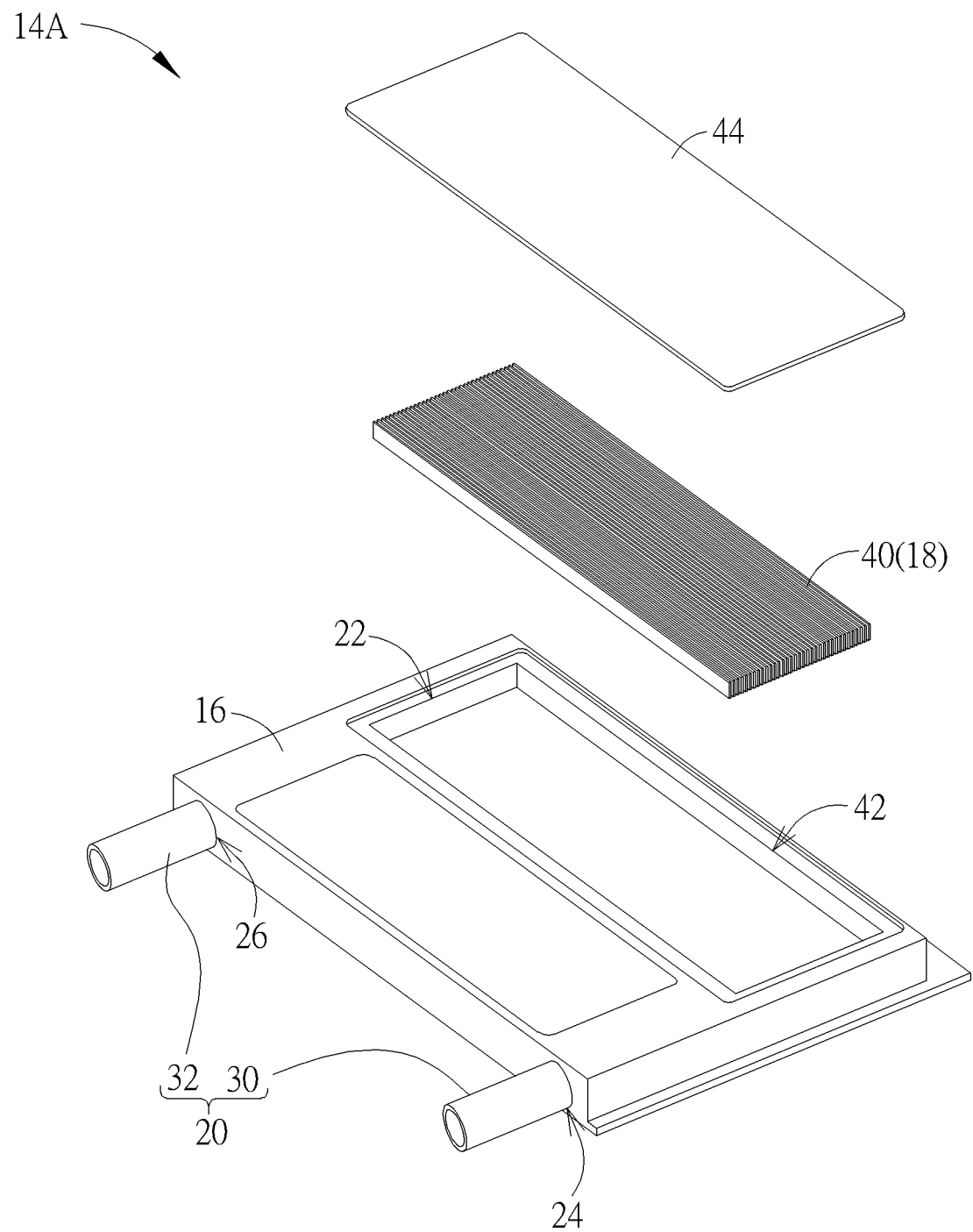
FIG. 7 is an exploded diagram of the liquid cooling device in another application according to the second embodiment of the present application.

Please refer to FIG. 7. FIG. 7 is an exploded diagram of the liquid cooling device 14A in another application according to the second embodiment of the present application. As shown in FIG. 7, the plurality of heat dissipation fins 40 is not dived into several fin groups, and a length of each heat dissipation fin 40 can be the same as or similar to the width of the accommodating structure 22. The arrangement density of the plurality of heat dissipation fins 40 can be designed and adjusted in accordance with the heat generated by the plurality of optical transceivers 12, and therefore the liquid cooling device 14A can rapidly dissipate the heat generated by the optical transceiver 12.

Figure 8:
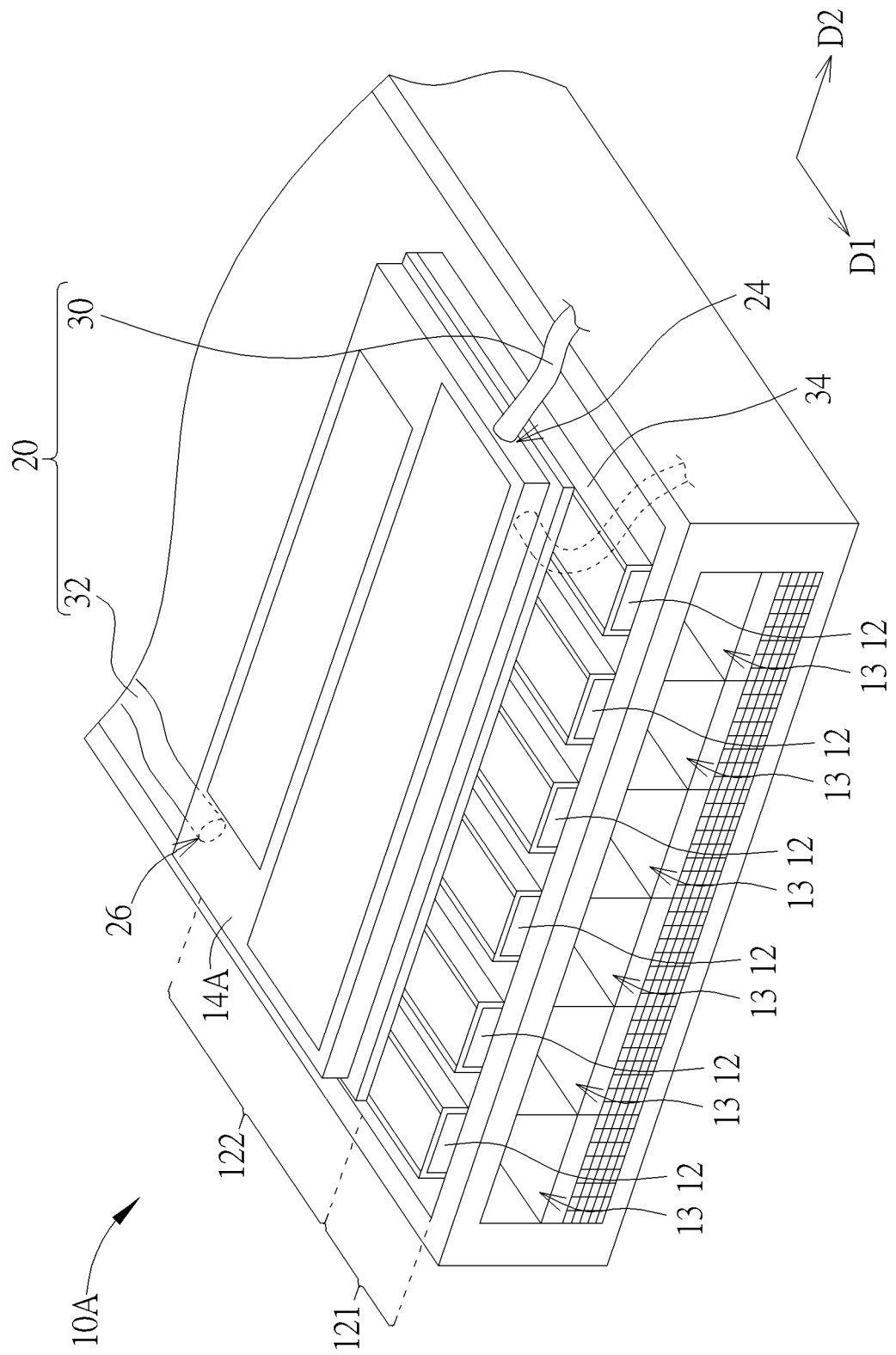
FIG. 8 is a diagram of the liquid cooling device in another variation according to the second embodiment of the present application.

Please refer to FIG. 3 and FIG. 8. FIG. 8 is a diagram of the liquid cooling device 14A in another variation according to the second embodiment of the present application. The optical transceiver 12 can include several sections connected with each other along a longitudinal direction D1, such as a first section 121 and a second section 122. The heat source (which is not marked in the figures) of the optical transceiver 12 may be disposed on the first section 121, or disposed on the second section 122, or simultaneously disposed on the first section 121 and the second section 122. In the embodiment shown in FIG. 3, the length of the main body 16 can correspond to a sun of lengths of the first section 121 and the second section 122. In the embodiment shown in FIG. 8, the length of the main body 16 can correspond to the length of the second section 122; however, the main body 16 may be optionally disposed on the front of the optical transceiver 12 and have a length corresponding to the length of the first section 121. The liquid cooling device 14A capable of aligning with a place whereon the heat source of the optical transceiver 12 is located can belong to the design scope of the present application.

For applying the liquid cooling device 14A simultaneously to the plurality of optical transceivers 12, the width of the main body 16 can preferably correspond to a sum of the widths of the plurality of optical transceivers 12 along a transverse direction D2. In addition, the inlet structure 24 and the outlet structure 26 of the liquid cooling device 14A (or the liquid cooling device 14) are not limited to be disposed on the same side of the main body 16. As shown in FIG. 8, the inlet structure 24 and the outlet structure 26 may be optionally disposed on the adjacent sides or opposite sides of the main body 16, which depends on the design demand. If the electronic apparatus 10A includes two or more than two liquid cooling devices 14A, the outlet tube 32 of one liquid cooling device 14A can be connected to another liquid cooling device 14A, and the coolant can freely flow between the plurality of liquid cooling devices 14A.

In conclusion, the liquid cooling device of the present application is not locked with the optical transceiver, and is installed on the supporting frame so that the optical transceiver can be freely removed in response to a combination of the liquid cooling device and the supporting frame. The supporting frame can hold the plurality of optical transceivers; due to the high heat generation rate and the high transmission rate of the optical transceiver, the present application can design the dense micro flowing channels inside the liquid cooling device, and the size of the main body and the number of the flowing channel of the liquid cooling device can be designed in accordance with a heat generation quantity and a number of the optical transceiver, so that the liquid cooling device can rapidly and effectively dissipate the heat generated by the plurality of optical transceivers. The liquid cooling device of the present application can be directly installed on the conventional supporting frame, instead of designing a new-type supporting frame, and can be widespread applied for all kinds of electronic apparatus.

Those skilled in the art will readily observe that numerous modifications and alterations of the device and method may be made while retaining the teachings of the application. Accordingly, the above disclosure should be construed as limited only by the metes and bounds of the appended claims.

What is claimed is:

1. A liquid cooling device applied to a plurality of optical transceivers disposed inside a supporting frame, the liquid cooling device comprising:
   a main body having an accommodating structure, an inlet structure and an outlet structure, the inlet structure and the outlet structure being connected to the accommodating structure, the main body having a flat bottom surface that is in fluid communication with the accommodating structure directly contacting against a top surface of each of the optical transceivers through an open hole of the supporting frame;
   a channel module disposed inside the accommodating structure; and
   a tube module having an inlet tube and an outlet tube, the inlet tube and an outlet tube being respectively disposed on the inlet structure and the outlet structure.

2. The liquid cooling device of claim 1, wherein a coolant is accommodated inside the accommodating structure, and a flowing direction of the coolant is guided by the tube module.

3. The liquid cooling device of claim 1, wherein the channel module comprises an exhausting channel, the exhausting channel has a plurality of sections connected to each other, the plurality of sections are bent to align with corresponding sides of the accommodating structure.

4. The liquid cooling device of claim 2, wherein the channel module comprises a plurality of heat dissipation fins, two opposite ends of each of the plurality of heat dissipation fins respectively point toward the inlet structure and the outlet structure.

5. The liquid cooling device of claim 4, wherein one of the plurality of heat dissipation fins is spaced from an adjacent heat dissipation fin of the plurality of heat dissipation fins via a predefined distance.

6. The liquid cooling device of claim 4, wherein the plurality of heat dissipation fins at least comprises a first fin group and a second fin group, the first fin group and the second fin group respectively align with any one or several of the plurality of optical transceivers.

7. The liquid cooling device of claim 6, wherein the first fin group is spaced from the second fin group, and a first gap between the first fin group and the second fin group aligns with a second gap between any two adjacent optical transceivers of the plurality of optical transceivers.

8. The liquid cooling device of claim 6, wherein a structural size and an arrangement density of the first fin group are different from a structural size and an arrangement density of the second fin group, an outer dimension of the first fin group that is intersected to a flow direction of the first fin group is different from an outer dimension of the second fin group that is intersected to a flow direction of the second fin group.

9. The liquid cooling device of claim 6, wherein the first fin group and the second fin group are arranged in symmetry.

10. The liquid cooling device of claim 2, wherein the main body further has a cover, and an opening of the accommodating structure is sealed by the cover.

11. The liquid cooling device of claim 1, wherein a longitudinal direction of each of the plurality of optical transceivers comprises a first section and a second section connected with each other, a heat source is disposed on at least one of the first section and the second section, a length of the main body corresponds to a length of the first section or the second section, or corresponds to a sum of lengths of the first section and the second section.

12. The liquid cooling device of claim 11, wherein a width of the main body corresponds to a sum of widths of the plurality of optical transceivers along a transverse direction, and at least one section of the plurality of optical transceivers is sheltered by the main body.

13. The liquid cooling device of claim 1, wherein the inlet structure and the outlet structure are disposed on the same side of the main body, or disposed on two adjacent sides of the main body, or disposed on two opposite sides of the main body.

14. An electronic apparatus comprising:
   a plurality of optical transceivers disposed inside a supporting frame; and
   a liquid cooling device applied to the plurality of optical transceivers, the liquid cooling device comprising:
      a main body having an accommodating structure, an inlet structure and an outlet structure, the inlet structure and the outlet structure being connected to the accommodating structure, of the main body having a flat bottom surface that is in fluid communication with the accommodating structure directly contacting against a top surface of each of the optical transceivers through an open hole of the supporting frame;
      a channel module disposed inside the accommodating structure; and
      a tube module having an inlet tube and an outlet tube, the inlet tube and an outlet tube being respectively disposed on the inlet structure and the outlet structure.

15. The electronic apparatus of claim 14, wherein a coolant is accommodated inside the accommodating structure, and a flowing direction of the coolant is guided by the tube module.

16. The electronic apparatus of claim 14, wherein the electronic apparatus comprises two liquid cooling devices, the outlet tube of one liquid cooling device of the two liquid cooling devices is connected to the inlet tube of another liquid cooling device of the two liquid cooling devices.

17. The electronic apparatus of claim 14, wherein the channel module comprises an exhausting channel, the exhausting channel has a plurality of sections connected to each other, the plurality of sections are bent to align with corresponding sides of the accommodating structure.

18. The electronic apparatus of claim 15, wherein the channel module comprises a plurality of heat dissipation fins, two opposite ends of each of the plurality of heat dissipation fins respectively point toward the inlet structure and the outlet structure, one of the plurality of heat dissipation fins is spaced from an adjacent heat dissipation fin of the plurality of heat dissipation fins via a predefined distance, the plurality of heat dissipation fins at least comprises a first fin group and a second fin group, the first fin group and the second fin group respectively align with any one or several of the plurality of optical transceivers, the first fin group is spaced from the second fin group, and a first gap between the first fin group and the second fin group aligns with a second gap between any two adjacent optical transceivers of the plurality of optical transceivers, the main body further has a cover, and an opening of the accommodating structure is sealed by the cover.

19. The electronic apparatus of claim 14, wherein a longitudinal direction of each of the plurality of optical transceivers comprises a first section and a second section connected with each other, a heat source is disposed on at least one of the first section and the second section, a length of the main body corresponds to a length of the first section or the second section, or corresponds to a sum of lengths of the first section and the second section, a width of the main body corresponds to a sum of widths of the plurality of optical transceivers along a transverse direction, and at least one section of the plurality of optical transceivers is sheltered by the main body.

20. A liquid cooling device applied to a plurality of optical transceivers disposed inside a supporting frame, the liquid cooling device comprising:
   a main body having an accommodating structure, an inlet structure and an outlet structure, the inlet structure and the outlet structure being connected to the accommodating structure, the liquid cooling device having a flat bottom surface that is in fluid communication with the accommodating structure directly contacting against a top surface of the optical transceiver;
   a channel module disposed inside the accommodating structure; and
   a tube module having an inlet tube and an outlet tube, the inlet tube and an outlet tube being respectively disposed on the inlet structure and the outlet structure.

* * * * *